(12) United States Patent
Makkar et al.

(10) Patent No.: US 11,686,769 B1
(45) Date of Patent: Jun. 27, 2023

(54) SIGNAL TOGGLING DETECTION AND CORRECTION CIRCUIT

(71) Applicant: NXP B.V., Eindhoven (NL)

(72) Inventors: Shikhar Makkar, Palwal (IN); Nikila Krishnamoorthy, Chennai (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/647,076

(22) Filed: Jan. 5, 2022

(51) Int. Cl.
*G01R 31/3177* (2006.01)
*G01R 31/3185* (2006.01)
*G01R 31/3183* (2006.01)

(52) U.S. Cl.
CPC ..  *G01R 31/3177* (2013.01); *G01R 31/318328* (2013.01); *G01R 31/318342* (2013.01); *G01R 31/318541* (2013.01); *G01R 31/318552* (2013.01)

(58) Field of Classification Search
CPC ........ G01R 31/3177; G01R 31/318328; G01R 31/318342; G01R 31/318541; G01R 31/318552
USPC ................ 714/727, 724, 726, 729, 731, 735
See application file for complete search history.

(56) References Cited

U.S. PATENT DOCUMENTS

| | | | | |
|---|---|---|---|---|
| 5,307,050 | A * | 4/1994 | Patton | F23N 5/242 340/517 |
| 8,373,435 | B2 * | 2/2013 | Bogenberger | G06F 11/1641 326/14 |
| 8,717,829 | B2 | 5/2014 | Sharma et al. | |
| 8,841,952 | B1 | 9/2014 | Singh et al. | |
| 9,329,927 | B2 * | 5/2016 | Ito | G06F 11/1695 |
| 9,465,073 | B2 | 10/2016 | Kim | |
| 10,613,926 | B2 | 4/2020 | Schat | |
| 2014/0331109 | A1 * | 11/2014 | Wakuda | H04L 1/24 714/799 |
| 2017/0249224 | A1 * | 8/2017 | Suzuki | G06F 11/27 |
| 2022/0334176 | A1 * | 10/2022 | Abhishek | G11C 29/12 |

OTHER PUBLICATIONS

Ostanin et al., A Fault-tolerant Sequential Circuit Design for Soft Errors Based on Fault-Secure Circuit, 2016, IEEE, pp. 1-4. (Year: 2016).*

* cited by examiner

Primary Examiner — John J Tabone, Jr.

(57) ABSTRACT

The signal toggling detection and correction circuit includes a flip-flop, a checker circuit, and a fault monitoring circuit that includes a restoration circuit. Based on faults such as soft errors and unintended bit toggles in the flip-flop, a flop output signal toggles. A set of checker signals outputted by the checker circuit may toggle based on toggling of the flop output signal and a restoration signal of the restoration circuit. Based on the toggling of at least one checker signal, the fault monitoring circuit determines whether the flip-flop or the checker circuit is faulty. When the checker circuit is faulty, the fault monitoring circuit corrects the toggling of at least one checker signal. When the flip-flop is faulty, the fault monitoring circuit corrects the toggling of one of the toggled flop output signal or the restoration signal and further corrects the toggled checker signal.

20 Claims, 8 Drawing Sheets

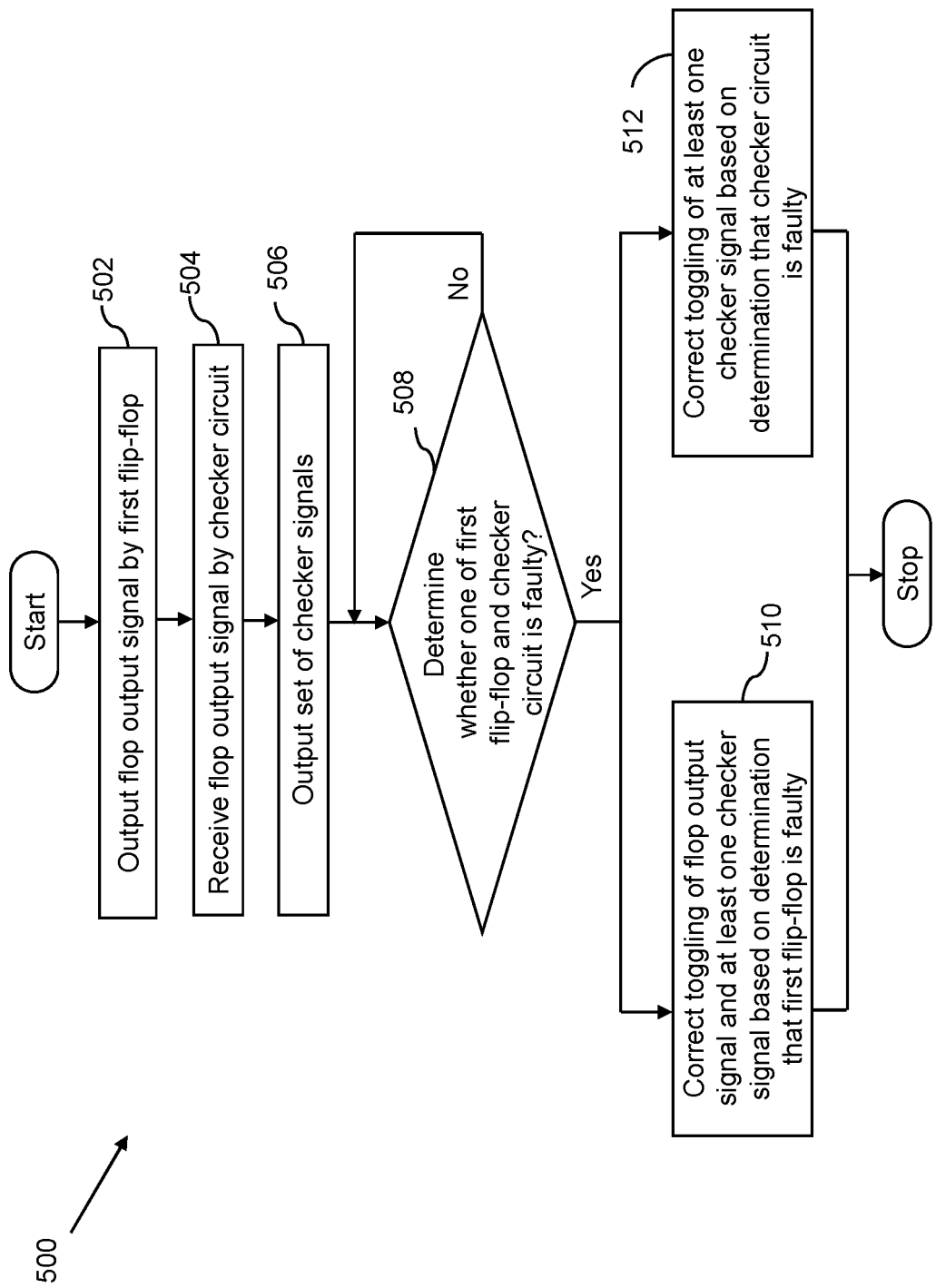

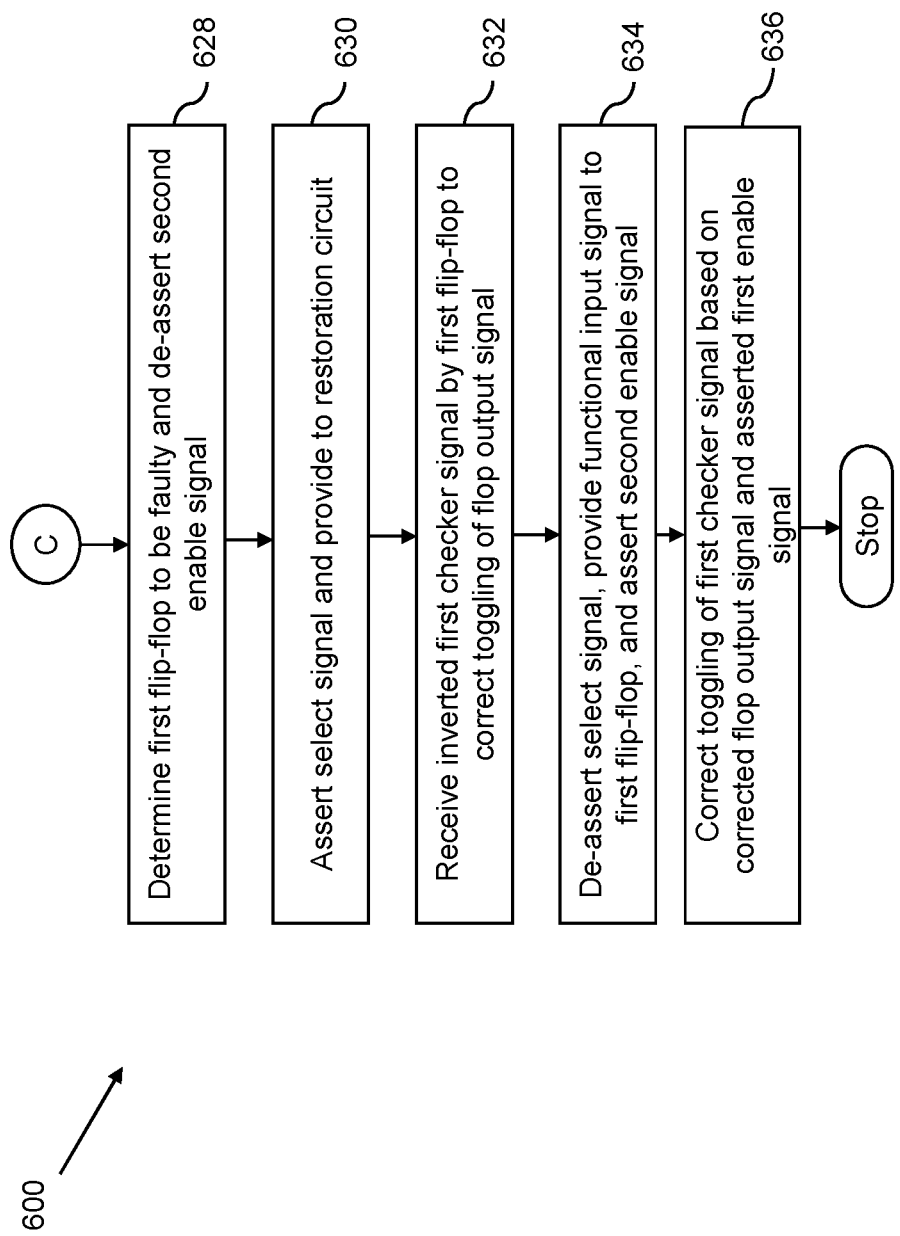

SIGNAL TOGGLING DETECTION AND CORRECTION CIRCUIT

FIELD OF USE

The present disclosure relates generally to electronic circuits, and, more particularly, to a signal toggling detection and correction circuit.

BACKGROUND

Integrated circuits (IC) include registers that store safety-critical data and security-critical data. The safety-critical data is indicative of system configuration information of an IC, whereas the security-critical data is indicative of data encryption and keys. When faults (e.g., soft errors, single event upsets, and bit toggles) occur in the registers, the safety-critical data and the security-critical data are compromised.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIG. 5 represents a high-level flowchart illustrating the operation of the signal toggling detection and correction circuit of FIG. 2 in accordance with an embodiment of the present disclosure; and FIGS. 6A-6C represent a flowchart illustrating the operation of a functional controller, a control circuit, and the signal toggling detection and correction circuit of FIG. 2 in accordance with an embodiment of the present disclosure.

DETAILED DESCRIPTION

Figure 1:
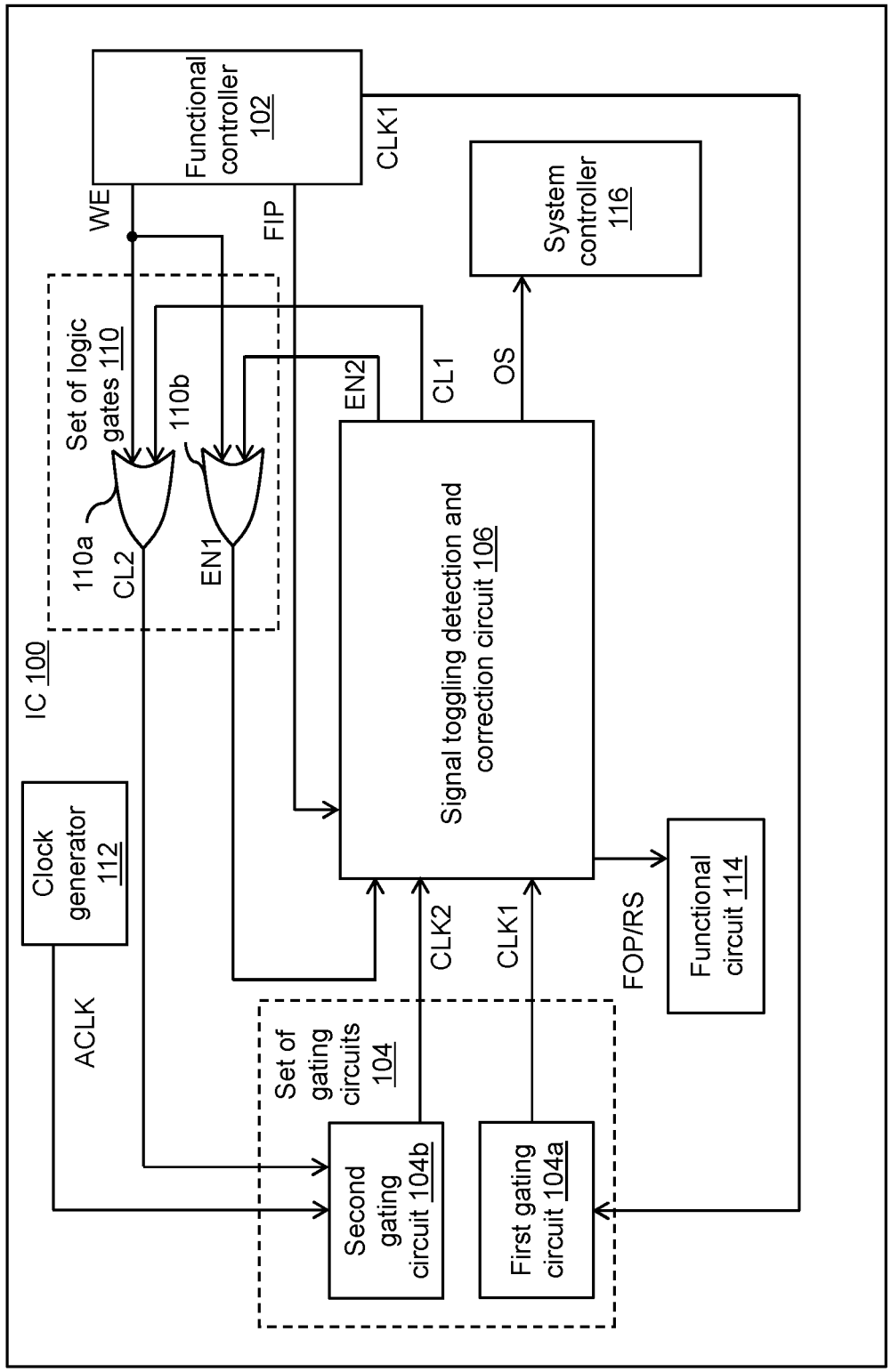
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In one embodiment, a signal toggling detection and correction circuit is disclosed. The signal toggling detection and correction circuit may include a first flip-flop that is configured to output a flop output signal. The flop output signal may toggle based on a fault in the first flip-flop. The signal toggling detection and correction circuit may further include a checker circuit that is coupled to the first flip-flop. The checker circuit may be configured to receive the flop output signal and output a set of checker signals based on the flop output signal. At least one checker signal of the set of checker signals may toggle based on one of a group consisting of the fault in the first flip-flop and a fault in the checker circuit. Further, the signal toggling detection and correction circuit may include a fault monitoring circuit configured to determine whether one of a group consisting of the first flip-flop and the checker circuit is faulty based on the toggling of the at least one checker signal of the set of checker signals. Based on the determination that the first flip-flop is faulty, the fault monitoring circuit may be configured to correct the toggling of the flop output signal and the toggling of the at least one checker signal of the set of checker signals. Based on the determination that the checker circuit is faulty, the fault monitoring circuit may be configured to correct the toggling of the at least one checker signal of the set of checker signals.

In some embodiments, the signal toggling detection and correction circuit may further include the checker circuit. The checker circuit may include a latch configured to receive the flop output signal and a first enable signal. The latch may be configured to output a first checker signal of the set of checker signals. The checker circuit may further include a second flip-flop that is coupled to the latch. The second flip-flop may be configured to receive the first checker signal and a clock signal, and output a second checker signal of the set of checker signals. The second checker signal may be same as the first checker signal based on a transition of the clock signal. The first checker signal may toggle based on one of a group consisting of the toggling of the flop output signal and a fault in the latch. The second checker signal may toggle based on a fault in the second flip-flop. Further, the fault in the checker circuit may correspond to one of a group consisting of the fault in the latch and the fault in the second flip-flop.

In some embodiments, the signal toggling detection and correction circuit may further include the fault monitoring circuit. The fault monitoring circuit may include a logic circuit that is coupled to the latch and the second flip-flop. The logic circuit may be configured to receive the first checker signal and the second checker signal and output an error signal. The error signal may be asserted based on toggling of one of a group consisting of the first checker signal and the second checker signal.

In some embodiments, the fault monitoring circuit may further include a control circuit that is coupled to the logic circuit. The control circuit may be configured to receive the error signal, determine whether the error signal is in one of a group consisting of a de-asserted state and an asserted state, and output a second enable signal and a select signal. The first enable signal may be derived from the second enable signal such that assertion of the second enable signal may result in assertion of the first enable signal. Further the assertion of the first enable signal may result in the first checker signal being same as the flop output signal.

In some embodiments, when the control circuit determines that the error signal is in the de-asserted state, the control circuit may be configured to assert the second enable signal, and determine whether the error signal has transitioned to the asserted state after the assertion of the second enable signal. The control circuit may be further configured to determine that the first flip-flop may be faulty when the error signal has transitioned to the asserted state. The error signal may transition to the asserted state based on the toggling of the first checker signal as a result of the assertion of the first enable signal. Further, the control circuit may be configured to assert the select signal to correct the toggling of the flop output signal.

In some embodiments, the fault monitoring circuit may further include a restoration circuit. The restoration circuit may be coupled to the first flip-flop and the latch. The restoration circuit may be configured to receive the first checker signal, the select signal, and a functional input signal. The restoration circuit may be further configured to provide one of a group consisting of the functional input signal and an inverted first checker signal to the first flip-flop based on the select signal. Further, when the select signal is asserted, the restoration circuit may provide the inverted first checker signal to the first flip-flop to correct the toggling of the flop output signal.

In some embodiments, the control circuit may be further configured to de-assert the second enable signal after the error signal transitions to the asserted state. The toggling of the flop output signal may result in the toggling of the first checker signal. After the assertion of the select signal, the control circuit may be further configured to assert the second enable signal to correct the toggling of the first checker signal. The toggling of the first checker signal may be corrected based on the assertion of the first enable signal and the correction of the toggling of the flop output signal.

In some embodiments, the restoration circuit may include a first logic gate. The first logic gate may be coupled to the latch, and configured to receive the first checker signal and output the inverted first checker signal. The restoration circuit may further include a multiplexer coupled to the first logic gate and the first flip-flop. The multiplexer may be configured to receive the inverted first checker signal, the select signal, and the functional input signal. The multiplexer may be further configured to output one of the group consisting of the functional input signal and the inverted first checker signal based on the select signal. When the select signal is asserted, the inverted first checker signal may be provided to the first flip-flop, and when the select signal is de-asserted, the functional input signal may be provided to the first flip-flop.

In some embodiments, when the error signal is in the asserted state, the control circuit may be further configured to determine that one of a group consisting of the latch and the second flip-flop may be faulty. The control circuit may be further configured to assert the second enable signal. Further, the control circuit may be configured to determine whether the error signal has transitioned to the de-asserted state after the assertion of the second enable signal.

In some embodiments, when the control circuit determines that the error signal has remained in the asserted state, the control circuit may determine that the second flip-flop may be faulty. Based on the determination that the second flip-flop is faulty, the control circuit may be further configured to generate a clock control signal to assert the clock signal and correct the toggling of the second checker signal.

In some embodiments, when the control circuit determines that the error signal has transitioned to the de-asserted state, the control circuit may determine that the latch may be faulty. The second enable signal may remain asserted to correct the toggling of the first checker signal.

In another embodiment, a signal toggling detection and correction circuit is disclosed. The signal toggling detection and correction circuit may include a first flip-flop. The first flip-flop may be configured to output a flop output signal. The signal toggling detection and correction circuit may further include a checker circuit that is coupled to the first flip-flop. The checker circuit may be configured to receive a restoration signal that may be outputted based on the flop output signal and output a set of checker signals based on the restoration signal. The restoration signal may toggle based on a fault in the first flip-flop. At least one checker signal of the set of checker signals may toggle based on one of a group consisting of the fault in the first flip-flop and a fault in the checker circuit. Further, the signal toggling detection and correction circuit may include a fault monitoring circuit. The fault monitoring circuit may be configured to determine whether one of a group consisting of the first flip-flop and the checker circuit is faulty based on the toggling of the at least one checker signal of the set of checker signals. Based on the determination that the first flip-flop is faulty, the fault monitoring circuit may be configured to correct the toggling of the restoration signal and the toggling of the at least one checker signal of the set of checker signals. Further, based on the determination that the checker circuit is faulty, the fault monitoring circuit may be configured to correct the toggling of the at least one checker signal of the set of checker signals.

In some embodiments, the signal toggling detection and correction circuit may further include the checker circuit. The checker circuit may include a latch configured to receive the restoration signal and a first enable signal. The latch may be configured to output a first checker signal of the set of checker signals. The first checker signal may be same as the restoration signal based on assertion of the first enable signal. Further, the checker circuit may include a second flip-flop that is coupled to the latch. The second flip-flop may be configured to receive the first checker signal and a clock signal, and output a second checker signal of the set of checker signals. The second checker signal may be same as the first checker signal based on a transition of the clock signal. The first checker signal may toggle based on one of a group consisting of the toggling of the restoration signal and a fault in the latch. The second checker signal may toggle based on a fault in the second flip-flop. Further, the fault in the checker circuit may correspond to one of a group consisting of the fault in the latch and the fault in the second flip-flop.

In some embodiments, the fault monitoring circuit further comprises a control circuit that is coupled to the logic circuit. The control circuit may be configured to receive the error signal, determine whether the error signal is in one of a group consisting of a de-asserted state and an asserted state, and output a second enable signal and a select signal. The first enable signal may be derived from the second enable signal such that assertion of the second enable signal may result in assertion of the first enable signal. The assertion of the first enable signal may result in the first checker signal being same as the restoration signal.

In some embodiments, when the control circuit determines that the error signal is in the de-asserted state, the control circuit may be configured to assert the second enable signal, and determine whether the error signal has transitioned to the asserted state after the assertion of the second enable signal. The control circuit may be further configured to determine that the first flip-flop may be faulty when the error signal has transitioned to the asserted state. The error signal may transition to the asserted state based on the toggling of the first checker signal as a result of the assertion of the first enable signal. Further, the control circuit may be configured to assert the select signal to correct the toggling of the restoration signal.

In some embodiments, the fault monitoring circuit further includes a restoration circuit that is coupled to the first flip-flop and the latch. The restoration circuit may be configured to receive the first checker signal, the select signal, and the flop output signal. The restoration circuit may be further configured to provide one of a group consisting of the flop output signal and an inverted first checker signal to the checker circuit based on the select signal. When the select signal is asserted, the restoration circuit may provide the inverted first checker signal as the restoration signal to the checker circuit to correct the toggling of the restoration signal.

In some embodiments, the first enable signal may be derived from the second enable signal such that assertion of the second enable signal results in assertion of the first enable signal. Further, when the first checker signal may toggle based on the toggling of the restoration signal, the toggling of the first checker signal may be corrected based on the assertion of the first enable signal and the correction of the toggling of the restoration signal.

In yet another embodiment of the present disclosure, a signal toggling detection and correction circuit is disclosed. The signal toggling detection and correction circuit may include a first flip-flop configured to output a flop output signal. The signal toggling detection and correction circuit may further include a checker circuit configured to receive one of a group consisting of the flop output signal and a restoration signal, and output the set of checker signals. One of a group consisting of (i) the flop output signal and (ii) the restoration signal may toggle based on a fault in the first flip-flop. At least one checker signal of the set of checker signals may toggle based on one of a group consisting of the fault in the first flip-flop and a fault in the checker circuit. Further, the signal toggling detection and correction circuit may include a fault monitoring circuit configured to determine whether one of a group consisting of the first flip-flop and the checker circuit may be faulty based on the toggling of the at least one checker signal of the set of checker signals. Based on the determination that the first flip-flop is faulty, the fault monitoring circuit may be configured to correct (i) the toggling of one of a group consisting of the flop output signal and the restoration signal, and (ii) the toggling of the at least one checker signal of the set of checker signals. Further, based on the determination that the checker circuit is faulty, the fault monitoring circuit may be configured to correct the toggling of the at least one checker signal of the set of checker signals.

Conventionally, to resolve faults occurring due to toggling of signals, correction circuitry is included on an IC to test the IC intermittently. The correction circuitry may typically include a fault-tolerant circuit such as a triple modular redundancy circuit, error correction code generators, or the like. Such correction circuitry takes a significant amount of time to test the IC during which functional operations are halted. As a result, the availability of the IC significantly degrades. Further, faults may occur in the correction circuitry that may in turn be introduced in registers of the IC. As a result, the reliability of the IC degrades.

Various embodiments of the present disclosure disclose an IC that may include a signal toggling detection and correction circuit. The signal toggling detection and correction circuit may include a first flip-flop, a checker circuit, and a fault monitoring circuit. The first flip-flop may output a flop output signal and the checker circuit may output a set of checker signals. Based on a fault in the first flip-flop, the flop output signal may toggle. At least one checker of the set of checker signals may toggle based on the toggling of the flop output signal. The fault monitoring circuit may determine whether the first flip-flop or the checker circuit is faulty. Based on the determination that the first flip-flop is faulty, the toggling of the flop output signal and the toggling of the at least one checker signal may be corrected. Further, based on the determination that the checker circuit is faulty, the toggling of the at least one checker signal may be corrected.

Alternatively, the toggling of the flop output signal leads to toggling of a restoration signal of the signal toggling detection and correction circuit. In such a scenario, the toggling of the restoration signal may be corrected by the signal toggling detection and correction circuit.

In the IC of the present disclosure, the presence of faults in the first flip-flop and the checker circuit is identified by detecting the toggling of signals outputted by the first flip-flop and the checker circuit. Each toggled signal may be corrected by the signal toggling detection and correction circuit in a single clock cycle. The signal toggling detection and correction circuit may further differentiate whether the toggling of signals occurs due to a fault in the checker circuit or a fault in the first flip-flop and corrects the toggling of the signals based on the differentiation. Further, while the signal toggling detection and correction is performed in the IC, other functional operations may be performed simultaneously. Thus, the availability and the reliability of the IC significantly increase.

FIG. 1 illustrates a schematic block diagram of an integrated circuit (IC) 100 in accordance with an embodiment of the present disclosure. The IC 100 may include a functional controller 102 and a set of gating circuits 104 of which a first gating circuit 104a and a second gating circuit 104b are shown. The IC 100 may further include a signal toggling detection and correction circuit 106, a set of logic gates 110, a clock generator 112, a functional circuit 114, and a system controller 116. The signal toggling detection and correction circuit 106 may include a first flip-flop, a second flip-flop, and a latch (shown later in FIGS. 2 and 3). The first flip-flop may be a register that stores safety-critical data and security-critical data, such as system configuration information and data encryption information. The latch and the second flip-flop are redundant storage elements that store the same data as the first flip-flop. The IC 100 may be implemented in various systems such as consumer electronic systems (e.g., mobile phones, digital cameras, and media players), various automotive systems, various data processing systems, or the like.

The following table illustrates various signals described in FIG. 1:

| Signals | Description |
| --- | --- |
| Functional input signal FIP | Safety-critical data and security-critical data in a static or quasistatic state |
| First clock signal CLK1 | Based on a logic state of the first clock signal CLK1, an output of the first flip-flop of the signal toggling detection and correction circuit 106 may be controlled |
| Second clock signal CLK2 | Clock signal that may control an output of the second flip-flop of the signal toggling detection and correction circuit 106 |

| Signals | Description |
|---|---|
| Fault output signal OS | Signal enabling the system (including the IC 100), to be put into a safe-state due to a fault in the first flip-flop of the signal toggling detection and correction circuit 106 |
| Auxiliary clock signal ACLK | Clock signal provided to the second gating circuit 104b to operate at a different duty cycle than the original duty cycle of the first clock signal CLK1 |
| First clock control signal CL1 | Signal that may be asserted based on the presence of a fault in the second flip-flop in the signal toggling detection and correction circuit 106 |
| Second clock control signal CL2 | Signal derived from (e.g., generated based on) the first clock control signal CL1 |
| First enable signal EN1 | Enable signal provided to the signal toggling detection and correction circuit 106 to control the latch of the signal toggling detection and correction circuit 106 |
| Second enable signal EN2 | Signal outputted based on determination of a faulty component in the signal toggling detection and correction circuit 106 |
| Write enable signal WE | Signal that may enable the functional input signal FIP to be written to the first flip-flop |

The functional controller 102 may be coupled to the set of gating circuits 104, the signal toggling detection and correction circuit 106, and the set of logic gates 110. The functional controller 102 may include suitable circuitry that may be configured to perform one or more operations. For example, the functional controller 102 may be configured to generate and provide a functional input signal FIP to the signal toggling detection and correction circuit 106. The functional input signal FIP may be indicative of safety-critical data and security-critical data such as system configuration data, data encryption key, and the like.

The functional controller 102 may be configured to generate a write enable signal WE. Based on the write enable signal WE (e.g., a logic high state of the write enable signal WE), the functional input signal FIP (e.g., data bit associated with the functional input signal FIP) may be written to the signal toggling detection and correction circuit 106. The functional controller 102 may be further configured to provide the write enable signal WE to the set of logic gates 110. Further, the functional controller 102 may be configured to generate a first clock signal CLK1. The first clock signal CLK1 may be a continuous clock signal. The functional controller 102 may be further configured to provide the first clock signal CLK1 to the first gating circuit 104a of the set of gating circuits 104.

The first gating circuit 104a may be coupled to the functional controller 102 and the signal toggling detection and correction circuit 106. The first gating circuit 104a may be further configured to receive the first clock signal CLK1 from the functional controller 102. Further, the first gating circuit 104a may be configured to output a continuous first clock signal CLK1 or a gated first clock signal CLK1 based on the programming of the first gating circuit 104a. The continuous first clock signal CLK1 may be utilized by the signal toggling detection and correction circuit 106 of FIG. 2. The continuous first clock signal CLK1 may be indicative of alternate high and low logic states of the first clock signal CLK1 in a continuous manner. Further, the gated first clock signal CLK1 may be utilized by the signal toggling detection and correction circuit 106 of FIG. 3. The gating of the first clock signal CLK1 may indicate that the first clock signal CLK1 may be asserted at an initial start-up of the system including the IC 100, and de-asserted after a pre-determined time interval. Further, the first clock signal CLK1 may be asserted based on a reboot of the system that includes the IC 100.

The second gating circuit 104b may be coupled to the signal toggling detection and correction circuit 106, the clock generator 112, and the set of logic gates 110. The second gating circuit 104b may be configured to output a second clock signal CLK2 based on an auxiliary clock signal ACLK generated by the clock generator 112. The second clock signal CLK2 may be further generated based on a first clock control signal CL1 that is outputted by the signal toggling detection and correction circuit 106 and a second clock control signal CL2 that is outputted by the set of logic gates 110. The second clock control signal CL2 may be asserted based on the assertion of the first clock control signal CL1. Further, when the second clock control signal CL2 is asserted, the second clock signal CLK2 is same as the auxiliary clock signal ACLK. Conversely, when the second clock control signal CL2 is de-asserted, the second clock signal CLK2 is de-asserted. Based on the second clock signal CLK2, the fault in the second flip-flop may be corrected.

The signal toggling detection and correction circuit 106 may be coupled to the functional controller 102, the set of gating circuits 104, the set of logic gates 110, and the functional circuit 114. The signal toggling detection and correction circuit 106 may be configured to perform various operations. For example, the signal toggling detection and correction circuit 106 may be configured to receive the functional input signal FIP from the functional controller 102. The signal toggling detection and correction circuit 106 may be further configured to receive the first clock signal CLK1 and the second clock signal CLK2 from the set of gating circuits 104, and a first enable signal EN1 from the set of logic gates 110. The signal toggling detection and correction circuit 106 may be further configured to output one of a flop output signal FOP and a restoration signal RS as explained in FIG. 2 and FIG. 3, respectively. The flop output signal FOP and the restoration signal RS are indicative of a presence of the fault in the first flip-flop.

The signal toggling detection and correction circuit 106 may be further configured to determine whether any of the first flip-flop, the second flip-flop, and the latch is faulty. The signal toggling detection and correction circuit 106 may be further configured to correct one of an output signal of the first flip-flop (such as the flop output signal FOP) or the restoration signal RS, and an output signal of the latch based on the determination that the first flip-flop is faulty. The signal toggling detection and correction circuit 106 may be further configured to correct an output signal of the latch based on the determination that the latch is faulty, and an output signal of the second flip-flop based on the determination that the second flip-flop is faulty.

The set of logic gates 110 may be coupled to the functional controller 102, the set of gating circuits 104, and the signal toggling detection and correction circuit 106. The set of logic gates 110 may be configured to receive the write enable signal WE from the functional controller 102. Further, the set of logic gates 110 may be configured to receive the first clock control signal CL1 and the second enable signal EN2 from the signal toggling detection and correction circuit 106. The set of logic gates 110 may be configured to output the first enable signal EN1 and the second clock control signal CL2. The set of logic gates 110 may include a first logic gate 110a and a second logic gate 110b. In an embodiment, each of the first logic gate 110a and the second logic gate 110b is an OR gate. In various other embodiments, other logic gates may be used without deviating from the scope of the present disclosure.

The first logic gate 110a may be configured to receive the write enable signal WE and the first clock control signal CL1 from the functional controller 102 and the signal toggling detection and correction circuit 106, respectively. The first logic gate 110a may be further configured to output the second clock control signal CL2 based on the write enable signal WE and the first clock control signal CL1. The second logic gate 110b may be configured to receive the write enable signal WE and the second enable signal EN2 from the functional controller 102 and the signal toggling detection and correction circuit 106, respectively. The second logic gate 110b may be further configured to output the first enable signal EN1 based on the write enable signal WE and the second enable signal EN2. The first logic gate 110a and the second logic gate 110b may be further configured to provide the second clock control signal CL2 and the first enable signal EN1 to the second gating circuit 104b and the signal toggling detection and correction circuit 106, respectively.

Thus, during a functional operation of the IC 100, the write enable signal WE is asserted to facilitate a functional write operation in the signal toggling detection and correction circuit 106. Hence, the first enable signal EN1 and the second clock control signal CL2 are asserted. As a result, the functional input signal FIP (e.g., a data bit associated with the functional input signal FIP) may be written to the first and second flip-flops and the latch of the signal toggling detection and correction circuit 106. The write enable signal WE is then de-asserted. Further, during the signal toggling detection and correction operations, the second enable signal EN2 and the first clock control signal CL1 are asserted by the signal toggling detection and correction circuit 106 in the above-described manner. At such instances, the assertion of the second enable signal EN1 results in assertion of the first enable signal EN1. Further, the assertion of the first clock control signal CL1 results in assertion of the second clock control signal CL2.

The clock generator 112 may be configured to generate and provide the auxiliary clock signal ACLK to the set of gating circuits 104. The auxiliary clock signal ACLK may be used when the IC 100 has to operate at a different duty cycle than the original duty cycle of the first clock signal CLK1.

The functional circuit 114 may be coupled to the signal toggling detection and correction circuit 106. The functional circuit 114 may be configured to receive an output signal of the signal toggling detection and correction circuit 106 (e.g., the flop output signal FOP or the restoration signal RS). The functional circuit 114 may receive the flop output signal FOP when the first clock signal CLK1 is a continuous clock signal. Further, the functional circuit 114 may receive the restoration signal RS when the first clock signal CLK1 is a gated clock signal. The functional circuit 114 may utilize the received output signal to execute various functional operations associated therewith and enable the working of the system that includes the IC 100.

The system controller 116 may be coupled to the signal toggling detection and correction circuit 106. The system controller 116 may be configured to receive the fault output signal OS from the signal toggling detection and correction circuit 106 when the signal toggling detection and correction circuit 106 determines that the first flip-flop is the faulty component of the signal toggling detection and correction circuit 106. The assertion of the fault output signal OS may indicate the system controller 116 to switch the state of operation of the IC 100 to a safe state. The safe state of operation of the IC 100 may enable the signal toggling detection and correction circuit 106 to perform the correction without causing any damage to the IC 100. The correction is performed in a single clock cycle of the first clock signal CLK1.

In the signal toggling detection and correction operation, the functional controller 102 may output the functional input signal FIP and assert the first clock signal CLK1 to enable the functional operation of the IC 100. In an example, the functional operation may correspond to communication of secure data from one component to another component of the IC 100. The data associated with the functional input signal FIP may be written to the first flip-flop based on the reception of the functional input signal FIP by the signal toggling detection and correction circuit 106 and assertion of the first clock signal CLK1. Similar data is written to the latch and the second flip-flop of the signal toggling detection and correction circuit 106 based on the output signal (flop output signal FOP) of the first flip-flop. The writing of data to the first flip-flop and the second flip-flop is enabled by the set of gating circuits 104 whereas the writing of data to the latch is enabled by the set of logic gates 110. The signal toggling detection and correction circuit 106 may further output one of the flop output signal FOP or the restoration signal RS that is indicative of the security-critical data stored in the first flip-flop.

When the first flip-flop is faulty, the flop output signal FOP toggles. The toggling of the flop output signal FOP may result in the toggling of the output signal of the latch. In another scenario, the toggling of the output signal of the latch may occur when the latch is faulty. Further, the toggling of an output signal of the second flip-flop may occur when the second flip-flop is faulty. The signal toggling detection and correction circuit 106 may determine the faulty component of the signal toggling detection and correction circuit 106 and correct the toggled output signal of the faulty component. When the correction of the toggled flop output signal FOP is being performed, the signal toggling detection and correction circuit 106 communicates with the system controller 116 to switch the state of operation of the IC 100 to a safe state. The functional circuit 114 does not process the flop output signal FOP in the safe state. Further, when the correction of the latch and the second flip-flop is being performed, the IC 100 need not remain in the safe state. Based on the correction of the toggled flop output signal FOP, the signal toggling detection and correction circuit 106 communicates with the system controller 116 to switch to a normal state of operation of the IC 100. The functional circuit 114 thus receives the corrected flop output signal FOP. In another scenario illustrated in FIG. 3, the restoration signal RS toggles based on the toggling of the flop output signal FOP and the correction of the restoration signal RS is performed in a manner similar to the correction of the toggled flop output signal FOP as explained above. Further, the functional circuit 114 receives the corrected restoration signal RS.

Figure 2:
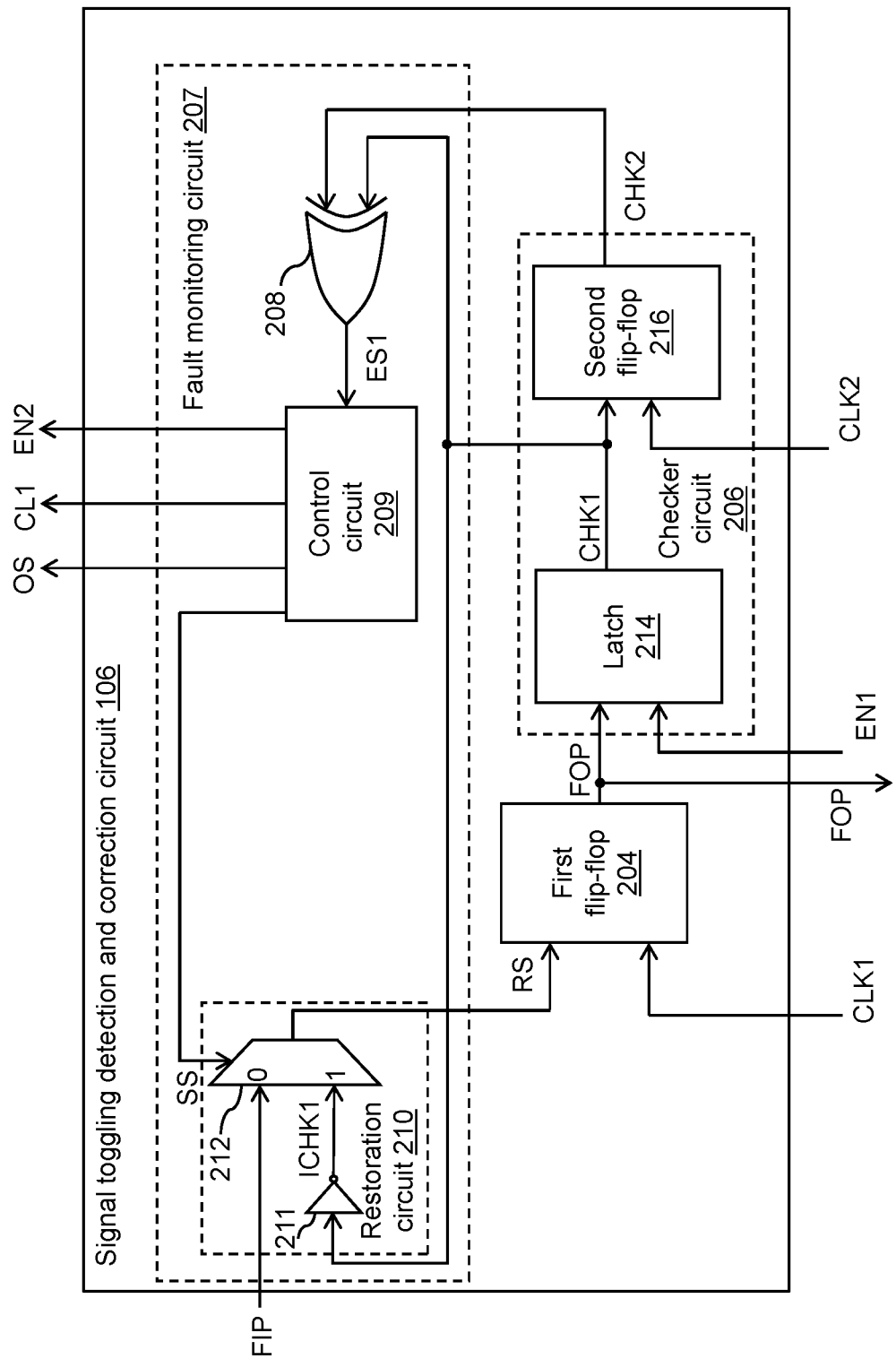
FIG. 2 illustrates a schematic block diagram of a signal toggling detection and correction circuit of the IC of FIG. 1 in accordance with an embodiment of the present disclosure.

FIG. 2 illustrates a schematic block diagram of the signal toggling detection and correction circuit 106 in accordance with an embodiment of the present disclosure. The signal toggling detection and correction circuit 106 may include a first flip-flop 204, a checker circuit 206, and a fault monitoring circuit 207. The fault monitoring circuit 207 includes a logic circuit 208, a control circuit 209, and a restoration circuit 210. The restoration circuit 210 may include a third logic gate 211 and a multiplexer 212. The checker circuit 206 may include a latch 214 and a second flip-flop 216. The signal toggling detection and correction circuit 106 may be configured to detect and correct the faults present in at least one of the first flip-flop 204, the latch 214, and the second flip-flop 216. Further, the first flip-flop, the latch, and the second flip-flop stated in FIG. 1 refer to the first flip-flop 204, the latch 214, and the second flip-flop 216, respectively.

The first flip-flop 204 may store safety-critical data and security-critical data. The latch 214 and the second flip-flop 216 are redundant storage elements that may store the same data as the first flip-flop 204. An output signal of the logic circuit 208 may be asserted when the first flip-flop 204 or the checker circuit 206 is faulty. Based on the asserted output signal, the control circuit 209 determines whether the first flip-flop 204, the latch 214, or the second flip-flop 216 may be faulty. The restoration circuit 210 may correct the toggling of the flop output signal FOP when the control circuit 209 determines that the first flip-flop 204 may be faulty. In addition, a toggled output signal of the latch 214 may be corrected based on the correction of the toggled flop output signal FOP. Further, when the control circuit 209 determines that the latch 214 or the second flip-flop 216 may be faulty, the control circuit 209 may provide correction signals by way of the set of logic gates 110 to the latch 214 or the second flip-flop 216 to correct the toggled output signals of the latch 214 and the second flip-flop 216.

The following table illustrates various signals described in FIG. 2:

| Signals | Description |
| --- | --- |
| Select signal SS | Enables the correction of toggling of an output signal of the first flip-flop 204 of the signal toggling detection and correction circuit 106 |
| Error signal ES1 | Signal indicating a fault (such as bit toggles, single event upsets, and soft errors) detected in the first flip-flop 204, the second flip-flop 216, or the latch 214 of the signal toggling detection and correction circuit 106 |
| Flop output signal FOP | Output of the first flip-flop 204. Toggling of the flop output signal FOP indicates a presence of a fault in the first flip-flop 204 |
| First checker signal CHK1 | Signal that may indicate a presence of a fault in the latch 214 and the first flip-flop 204 |
| Second checker signal CHK2 | Signal that may indicate a presence of the fault in the second flip-flop 216 |
| Inverted first checker signal ICHK1 | Inverted version of the first checker signal CHK1 |
| Restoration signal RS | Signal outputted to correct the toggling of the flop output signal FOP |

The first flip-flop 204 may be configured to receive the restoration signal RS and the first clock signal CLK1. The first clock signal CLK1 may be a continuous clock signal provided by the functional controller 102. Based on the restoration signal RS and the first clock signal CLK1, the first flip-flop 204 may be further configured to output the flop output signal FOP. During the functional operations of the IC 100, the select signal SS is de-asserted. Thus, the first flip-flop 204 receives the functional input signal FIP, and at a positive edge of the first clock signal CLK1, the functional input signal FIP is outputted as the flop output signal FOP.

When a fault occurs in the first flip-flop 204, the flop output signal FOP may toggle. In such a scenario, the select signal SS may be asserted, and the first flip-flop 204 may receive the inverted first checker signal ICHK1. Further, at a positive edge of the first clock signal CLK1, the inverted first checker signal ICHK1 is outputted as the flop output signal FOP.

Although it is described that the flop output signal FOP is outputted at a positive edge of the first clock signal CLK1 (e.g., when the first clock signal CLK1 transitions from a logic low state to a logic high state), the scope of the present disclosure is not limited to it. In various other embodiments, the flop output signal FOP may be outputted at a negative edge of the first clock signal CLK1 (e.g., when the first clock signal CLK1 transitions from a logic high state to a logic low state), without deviating from the scope of the present disclosure. In an embodiment, the first flip-flop 204 is a D flip-flop. In various other embodiments of the present disclosure, the first flip-flop 204 may be implemented in a different manner.

The checker circuit 206 may be coupled to the first flip-flop 204, the logic circuit 208, the second gating circuit 104b, and the second logic gate 110b. The checker circuit 206 may be configured to receive the flop output signal FOP, the first enable signal EN1, and the second clock signal CLK2. Further, the checker circuit 206 may be configured to output the first checker signal CHK1 and the second checker signal CHK2 based on the first enable signal EN1 and the second clock signal CLK2, respectively. The checker circuit 206 may include the latch 214 and the second flip-flop 216. In the present embodiment, the checker circuit 206 is shown to include a latch and a flip-flop, however, the scope of the present disclosure is not limited to it. In various embodiments, more than one latch and flip-flop may be utilized in the checker circuit 206, without deviating from the scope of the present disclosure.

The latch 214 may be coupled to the first flip-flop 204, the second logic gate 110b, and the second flip-flop 216. The latch 214 may be configured to receive the flop output signal FOP and the first enable signal EN1 from the first flip-flop 204 and the second logic gate 110b, respectively. The latch 214 may be further configured to output the first checker signal CHK1 based on the flop output signal FOP and the first enable signal EN1. When the first enable signal EN1 is asserted, the latch 214 may output the flop output signal FOP as the first checker signal CHK1. When the first enable signal EN1 is de-asserted, a logic state of the first checker signal CHK1 is retained.

During the functional operations of the IC 100, the first checker signal CHK1 is same as the functional input signal FIP. Further, the first checker signal CHK1 may toggle based on a fault in the latch 214 (i.e., when the latch 214 is faulty) or the toggling of the flop output signal FOP. When the first checker signal CHK1 toggles based on the toggling of the flop output signal FOP, the toggling of the first checker signal CHK1 may be corrected based on the assertion of the first enable signal EN1 and the correction of the toggling of the flop output signal FOP. When the first checker signal CHK1 toggles when the latch 214 is faulty, the toggling of the first checker signal CHK1 may be corrected based on the assertion of the first enable signal EN1.

The second flip-flop 216 may be coupled to the latch 214, the second gating circuit 104b, and the logic circuit 208. The second flip-flop 216 may be configured to receive the first checker signal CHK1 and the second clock signal CLK2 from the latch 214 and the second gating circuit 104b, respectively. The second flip-flop 216 may be further configured to output the second checker signal CHK2 based on the first checker signal CHK1 and the second clock signal CLK2. When the second clock signal CLK2 transitions from the de-asserted state to the asserted state, the second flip-flop 216 may output the first checker signal CHK1 as the second checker signal CHK2. When the second clock signal CLK2 is asserted, de-asserted, or transitions from the asserted state to the de-asserted state, a logic state of the second checker signal CHK2 is retained.

During the functional operations of the IC 100, the second checker signal CHK2 is same as the functional input signal FIP. Further, the second checker signal CHK2 may toggle based on a fault in the second flip-flop 216, i.e., when the second flip-flop 216 is faulty. The toggling of the second checker signal CHK2 may be corrected based on the assertion of the second clock signal CLK2. In an alternate embodiment, the second flip-flop 216 may further be configured to receive the flop output signal FOP in case of failure of the latch 214 of the checker circuit 206.

The fault monitoring circuit 207 is coupled with the set of logic gates 110, the first flip-flop 204, and the checker circuit 206. The fault monitoring circuit 207 is configured to determine whether one of a group consisting of the first flip-flop 204 and the checker circuit 206 is faulty based on the toggling of at least one checker signal of a set of checker signals. The set of checker signals includes the first checker signal CHK1 and the second checker signal CHK2. Based on the determination that the first flip-flop 204 is faulty, the fault monitoring circuit 207 is configured to correct the toggling of the flop output signal FOP and the toggling of the checker signal (such as the first checker signal CHK1 or the second checker signal CHK2). Further, based on the determination that the checker circuit 206 is faulty, the fault monitoring circuit 207 is configured to correct the toggled checker signal. The functioning of the fault monitoring circuit 207 is explained in terms of the logic circuit 208, the control circuit 209, and the restoration circuit 210. The fault monitoring circuit 207 is configured to receive the functional input signal FIP, the first checker signal CHK1, and the second checker signal CHK2, and output a first clock control signal CL1 and a second enable signal EN2.

The logic circuit 208 is coupled to the latch 214, the second flip-flop 216, and the control circuit 209. The logic circuit 208 may be configured to receive the first checker signal CHK1 and the second checker signal CHK2 from the latch 214 and the second flip-flop 216, respectively. Based on the first checker signal CHK1 and the second checker signal CHK2, the logic circuit 208 may be further configured to output the error signal ES1. The error signal ES1 may be asserted based on toggling of one of the first checker signal CHK1 and the second checker signal CHK2. The logic circuit 208 may be further configured to provide the error signal ES1 to the control circuit 209. In an embodiment, the logic circuit 208 is a logic gate such as an exclusive-OR (XOR) gate.

The control circuit 209 is coupled to the logic circuit 208, the set of logic gates 110, and the system controller 116. The control circuit 209 may be configured to receive the error signal ES1 from the logic circuit 208 and determine whether the error signal ES1 is in the de-asserted state or the asserted state. The error signal ES1 facilitates detection of the faulty components in the signal toggling detection and correction circuit 106. The faults in the first flip-flop 204, the latch 214, and the second flip-flop 216 may be due to soft errors, single event upsets, and unintended bit toggles occurring in the first flip-flop 204, the latch 214, and the second flip-flop 216, respectively. The control circuit 209 may be further configured to output the first clock control signal CL1, the second enable signal EN2, and the select signal SS to facilitate correction of the toggling of the flop output signal FOP, the first checker signal CHK1, and the second checker signal CHK2. The control circuit 209 may further output and provide the fault output signal OS to the system controller 116.

The restoration circuit 210 may be coupled to the first flip-flop 204 and the checker circuit 206. The restoration circuit 210 may be configured to receive the first checker signal CHK1 from the checker circuit 206. Further, the restoration circuit 210 may be configured to receive the functional input signal FIP and the select signal SS from the functional controller 102 and the control circuit 209, respectively. The restoration circuit 210 may further receive the first checker signal CHK1 from the latch 214. Based on the functional input signal FIP, the first checker signal CHK1, and the select signal SS, the restoration circuit 210 may be further configured to output the restoration signal RS. The functional input signal FIP may be outputted as the restoration signal RS when the select signal SS is de-asserted (e.g., is at a logic low state). Further, when the select signal SS is asserted (e.g., is at a logic high state), an inverted first checker signal ICHK1 may be outputted as the restoration signal RS. The restoration circuit 210 may be further configured to provide the restoration signal RS to the first flip-flop 204. The restoration circuit 210 may include the third logic gate 211 and the multiplexer 212.

The third logic gate 211 may be coupled to the latch 214. The third logic gate 211 may be configured to receive the first checker signal CHK1 from the latch 214. Based on the received first checker signal CHK1, the third logic gate 211 may be configured to output the inverted first checker signal ICHK1. In an embodiment, the third logic gate 211 is a NOT gate. In various other embodiments, other logic gates may be used without deviating from the scope of the present disclosure.

The multiplexer 212 may be coupled to the third logic gate 211, the first flip-flop 204, the functional controller 102, and the control circuit 209. The multiplexer 212 may be configured to receive the select signal SS, the inverted first checker signal ICHK1, and the functional input signal FIP from the control circuit 209, the third logic gate 211, and the functional controller 102, respectively. Further, the multiplexer 212 may receive the select signal SS at a select terminal thereof, and the functional input signal FIP and the inverted first checker signal ICHK1 at first and second input terminals (indicated as '0' and '1', respectively in FIG. 2) thereof. Based on the select signal SS, the multiplexer 212 may be configured to output, at an output terminal thereof, one of the inverted first checker signal ICHK1 and the functional input signal FIP as the restoration signal RS and provide the restoration signal RS to the first flip-flop 204. When the select signal SS is asserted, the inverted first checker signal ICHK1 may be provided as the restoration signal RS to the first flip-flop 204, and when the select signal SS is de-asserted, the functional input signal FIP may be provided as the restoration signal RS to the first flip-flop 204.

Scenario 1: To detect and correct toggling of the flop output signal FOP

When the error signal ES1 is in the de-asserted state, the control circuit 209 may determine that the first flip-flop 204 may be faulty or the signal toggling detection and correction circuit 106 may be devoid of any faults. Further, the control circuit 209 may assert the second enable signal EN2. The first enable signal EN1 may be asserted based on the second enable signal EN2 and provided to the signal toggling detection and correction circuit 106. The control circuit 209 may be further configured to determine whether the error signal ES1 has transitioned to the asserted state based on the assertion of the second enable signal EN2.

If the signal toggling detection and correction circuit 106 is devoid of any faults, the error signal ES1 remains in the de-asserted state. Thus, the control circuit 209 may de-assert the second enable signal EN2 and wait for a predetermined time period.

If the first flip-flop 204 is faulty, the flop output signal FOP may toggle. The toggled flop output signal FOP may lead to toggling of the first checker signal CHK1 when the first enable signal EN1 is asserted. Thus, the toggling of the first checker signal CHK1 due to the toggling of the flop output signal FOP may lead to the assertion of the error signal ES1. The control circuit 209 is further configured to de-assert the second enable signal EN2 after the error signal ES1 transitions to the asserted state. As the error signal ES1 has transitioned from the de-asserted state to the asserted state, the control circuit 209 may determine that the first flip-flop 204 may be faulty. To correct the toggling of the flop output signal FOP, the control circuit 209 may assert the select signal SS. The control circuit 209 may further provide the flop output signal FOP to the system controller 116 to switch the state of operation of the IC 100 to the safe state. As the select signal SS is asserted, the inverted first checker signal ICHK1 is received by the first flip-flop 204. Thus, at the positive edge of the first clock signal CLK1, the toggling of the flop output signal FOP is corrected. Further, after the assertion of the select signal SS, the control circuit 209 is configured to assert the second enable signal EN2 such that the correction of the toggling of the flop output signal FOP results in correction of the toggling of the first checker signal CHK1. For example, the flop output signal FOP and the first checker signal CHK1 are in the de-asserted state, and based on the fault in the first flip-flop 204, the flop output signal FOP and the first checker signal CHK1 toggle to the asserted state. In such a scenario, the assertion of the select signal SS and the first enable signal EN1 results in the flop output signal FOP and the first checker signal CHK1 transitioning to the de-asserted state based on the de-asserted state of the inverted first checker signal ICHK1.

Further, on correction of the toggling of the flop output signal FOP and the first checker signal CHK1, the select signal SS and the first enable signal EN1 may be de-asserted. Based on the de-assertion of the select signal SS, the multiplexer 212 may switch to output the functional input signal FIP to the first flip-flop 204. The first enable signal EN1 may be asserted at predetermined intervals to detect toggling of the flop output signal FOP.

Scenario 2: To detect and correct toggling of the second checker signal CHK2

If the second flip-flop 216 is faulty, the second checker signal CHK2 may toggle. The toggled second checker signal CHK2 may lead to the assertion of the error signal ES1. As the asserted error signal ES1 is received by the control circuit 209, the control circuit 209 may determine that the checker circuit 206 is faulty. The control circuit 209 may be further configured to assert the second enable signal EN2 to further determine whether the second flip-flop 216 is faulty or the latch 214 is faulty. If the control circuit 209 determines that the error signal ES1 remains asserted after the assertion of the second enable signal EN2, the control circuit 209 may determine that the second flip-flop 216 may be faulty.

To correct the toggling of the second checker signal CHK2, the control circuit 209 may be further configured to assert the first clock control signal CL1. Based on the assertion of the first clock control signal CL1, the second clock control signal CL2 may be asserted. Further, based on the assertion of the second clock control signal CL2, the second clock signal CLK2 may be asserted. As the second clock signal CLK2 is asserted, the toggling of the second checker signal CHK2 is corrected based on the first checker signal CHK1. For example, the first checker signal CHK1 and the second checker signal CHK2 are in the de-asserted state, and based on the fault in the second flip-flop 216, the second checker signal CHK2 toggles to the asserted state. In such a scenario, the assertion of the second clock signal CLK2 results in the second checker signal CHK2 transitioning to the de-asserted state based on the de-asserted state of the first checker signal CHK1. Thus, at the positive edge of the second clock signal CLK2, the toggling of the second checker signal CHK2 is corrected.

Scenario 3: To detect and correct toggling of the first checker signal CHK1

If the latch 214 may be faulty, the first checker signal CHK1 may toggle. The toggled first checker signal CHK1 may lead to the assertion of the error signal ES1. As the asserted error signal ES1 is received by the control circuit 209, the control circuit 209 may assert the second enable signal EN2 and determine whether the error signal ES1 remains asserted.

If the control circuit 209 determines that the error signal ES1 is de-asserted after the assertion of the second enable signal EN2, the control circuit 209 may determine that the latch 214 may be faulty. The first enable signal EN1 may be asserted based on the assertion of the second enable signal EN2. For example, the flop output signal FOP and the first checker signal CHK1 are in the de-asserted state, and based on the fault in the latch 214, the first checker signal CHK1 toggles to the asserted state. In such a scenario, the assertion of the first enable signal EN1 results in the first checker signal CHK1 transitioning to the de-asserted state based on the de-asserted state of the flop output signal FOP. Thus, the toggling of the first checker signal CHK1 may be corrected based on the assertion of the first enable signal EN1. In the present embodiment, the assertion of the error signal ES1 may indicate the toggling of at least one of the flop output signal FOP, the first checker signal CHK1, and the second checker signal CHK2. In various embodiments, the de-assertion of the error signal ES1 may indicate the toggling of at least one of the flop output signal FOP, the first checker signal CHK1, and the second checker signal CHK2.

Figure 3:
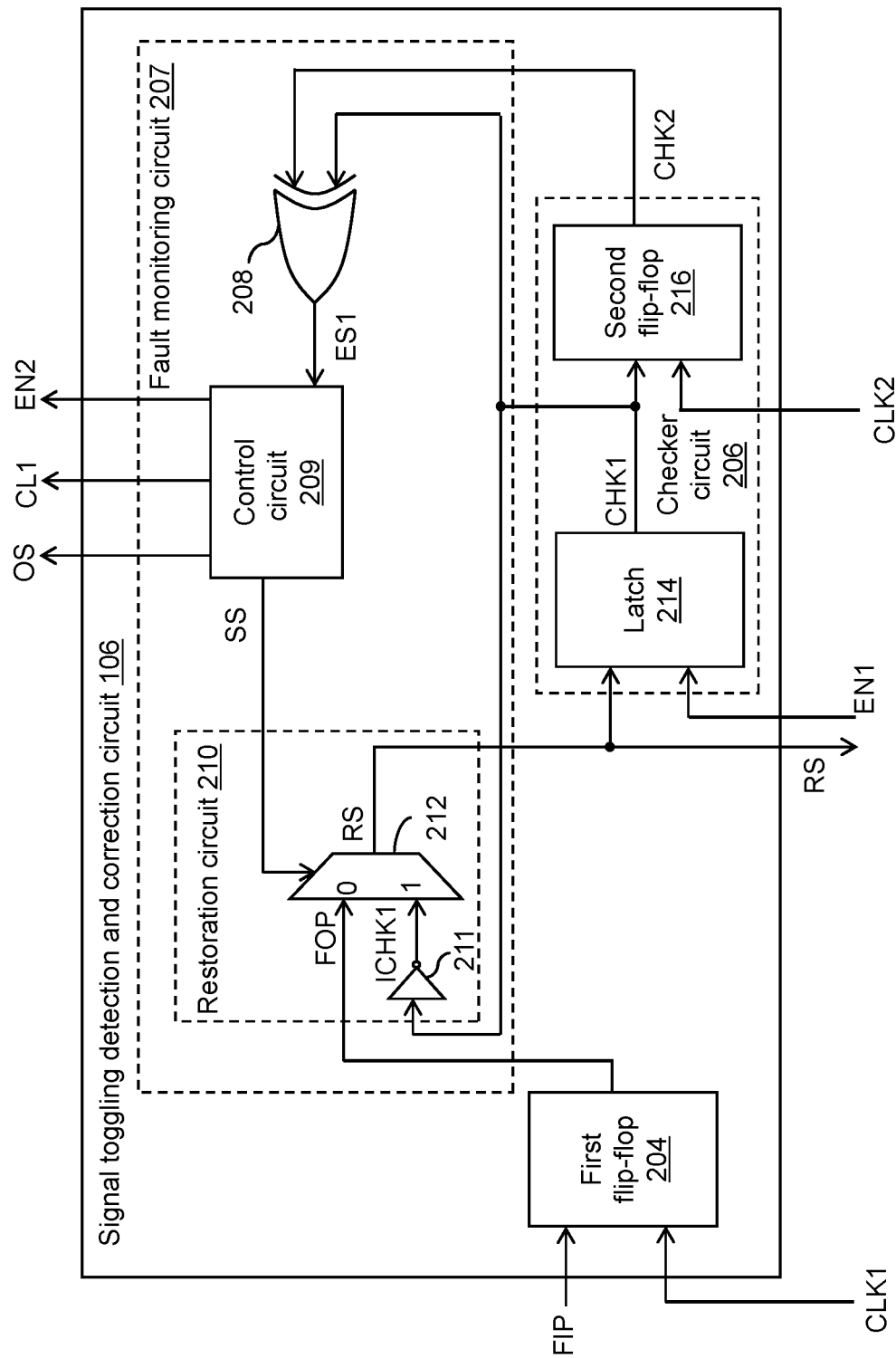
FIG. 3 illustrates a schematic block diagram of the signal toggling detection and correction circuit of the IC of FIG. 1 in accordance with another embodiment of the present disclosure.

FIG. 3 illustrates a schematic block diagram of the signal toggling detection and correction circuit 106 in accordance with another embodiment of the present disclosure. The signal toggling detection and correction circuit 106 may include the first flip-flop 204, the checker circuit 206, and the fault monitoring circuit 207. The fault monitoring circuit 207 includes the logic circuit 208, the control circuit 209, and the restoration circuit 210. The checker circuit 206 may include the latch 214 and the second flip-flop 216. The restoration circuit 210 may include the third logic gate 211 and the multiplexer 212. The restoration circuit 210 may be coupled to the first flip-flop 204 and the checker circuit 206.

The first flip-flop 204 may be coupled to the restoration circuit 210. The first flip-flop 204 may further be configured to receive the functional input signal FIP and the first clock signal CLK1, and output the flop output signal FOP. The flop output signal FOP may be provided based on the assertion of the first clock signal CLK1. The first clock signal CLK1 received by the first flip-flop 204 may be a gated clock signal. The flop output signal FOP may toggle based on a fault in the first flip-flop 204 (i.e., when the first flip-flop 204 is faulty). The checker circuit 206 may output the first checker signal CHK1 and the second checker signal CHK2 in a similar manner as explained in FIG. 2.

The fault monitoring circuit 207 is configured to determine whether one of the first flip-flop 204 and the checker circuit 206 is faulty based on the toggling of the checker signal (such as the first checker signal CHK1 or the second checker signal CHK2). Based on the determination that the first flip-flop 204 is faulty, the fault monitoring circuit 207 is configured to correct the toggling of the restoration signal RS and the toggling of the checker signal. Based on the determination that the checker circuit 206 is faulty, the fault monitoring circuit 207 is configured to correct the toggling of the checker signal.

The restoration circuit 210 may be configured to receive the flop output signal FOP from the first flip-flop 204. The restoration circuit 210 may be further configured to receive the select signal SS and the first checker signal CHK1 from the control circuit 209 and the checker circuit 206, respectively. Based on the flop output signal FOP, the inverted first checker signal ICHK1, and the select signal SS, the restoration circuit 210 may be configured to output the restoration signal RS. The flop output signal FOP may be outputted as the restoration signal RS when the select signal SS is de-asserted. Further, when the select signal SS is asserted, the inverted first checker signal ICHK1 may be outputted as the restoration signal RS. The assertion of the select signal SS may indicate that the first flip-flop 204 may be faulty.

The third logic gate 211 may be coupled to the latch 214, and configured to receive the first checker signal CHK1 and output the inverted first checker signal ICHK1. The multiplexer 212 may be configured to receive the flop output signal FOP at a first input terminal (indicated as '0' in FIG. 3), the inverted first checker signal ICHK1 from the third logic gate 211 at a second input terminal (indicated as '1' in FIG. 3), and the select signal SS at a select terminal thereof. Based on the select signal SS, the multiplexer 212 may be configured to output, at an output terminal thereof, the flop output signal FOP and the inverted first checker signal ICHK1 as the restoration signal RS.

When the control circuit 209 receives the error signal ES1 in the de-asserted state, the control circuit 209 may determine that the first flip-flop 204 may be faulty or the signal toggling detection and correction circuit 106 may be devoid of any faults. Further, the control circuit 209 may assert the second enable signal EN2. The first enable signal EN1 may be asserted based on the second enable signal EN2 and provided to the signal toggling detection and correction circuit 106. The control circuit 209 may be further configured to determine whether the error signal ES1 has transitioned to the asserted state based on the assertion of the second enable signal EN2.

The restoration signal RS may toggle based on the toggling of the flop output signal FOP. The toggling of the restoration signal RS leads to the toggling of the first checker signal CHK1 which in turn asserts the error signal ES1. As the error signal ES1 has transitioned from the de-asserted state to the asserted state, the control circuit 209 may determine that the first flip-flop 204 may be faulty. To correct the toggling of the restoration signal RS, the control circuit 209 may assert the select signal SS. In addition, the toggling of the flop output signal FOP may be corrected when the IC 100 is reset.

The checker circuit 206 may be configured to receive the restoration signal RS and the first enable signal EN1. The restoration circuit 210 may be configured to provide one of the flop output signal FOP and the inverted first checker signal ICHK1 to the checker circuit 206. The output of the restoration circuit 210 may be based on the select signal SS. When the restoration signal RS toggles, the select signal SS may be controlled such that the restoration circuit 210 may provide the inverted first checker signal ICHK1 to the checker circuit 206.

The first checker signal CHK1 may toggle based on one of the toggling of the restoration signal RS and a fault in the latch 214. When the first checker signal CHK1 toggles based on the toggling of the restoration signal RS, the toggling of the first checker signal CHK1 may be corrected based on the assertion of the first enable signal EN1 and the correction of the toggling of the restoration signal RS. When the first checker signal CHK1 toggles based on the fault in the latch 214, the toggling of the first checker signal CHK1 may be corrected based on the assertion of the first enable signal EN1.

The operation of the signal toggling detection and correction circuit 106 of FIG. 3 to detect and correct the toggling of the first checker signal CHK1 and the second checker signal CHK2 may be similar to the detection and correction of the toggling of the first checker signal CHK1 and the second checker signal CHK2 as explained in FIG. 2. Further, the operation of the control circuit 209 to output the select signal SS, the second enable signal EN2, and the first clock control signal CL1 is similar to the operation of the control circuit 209 as explained in FIG. 2.

Figure 4:
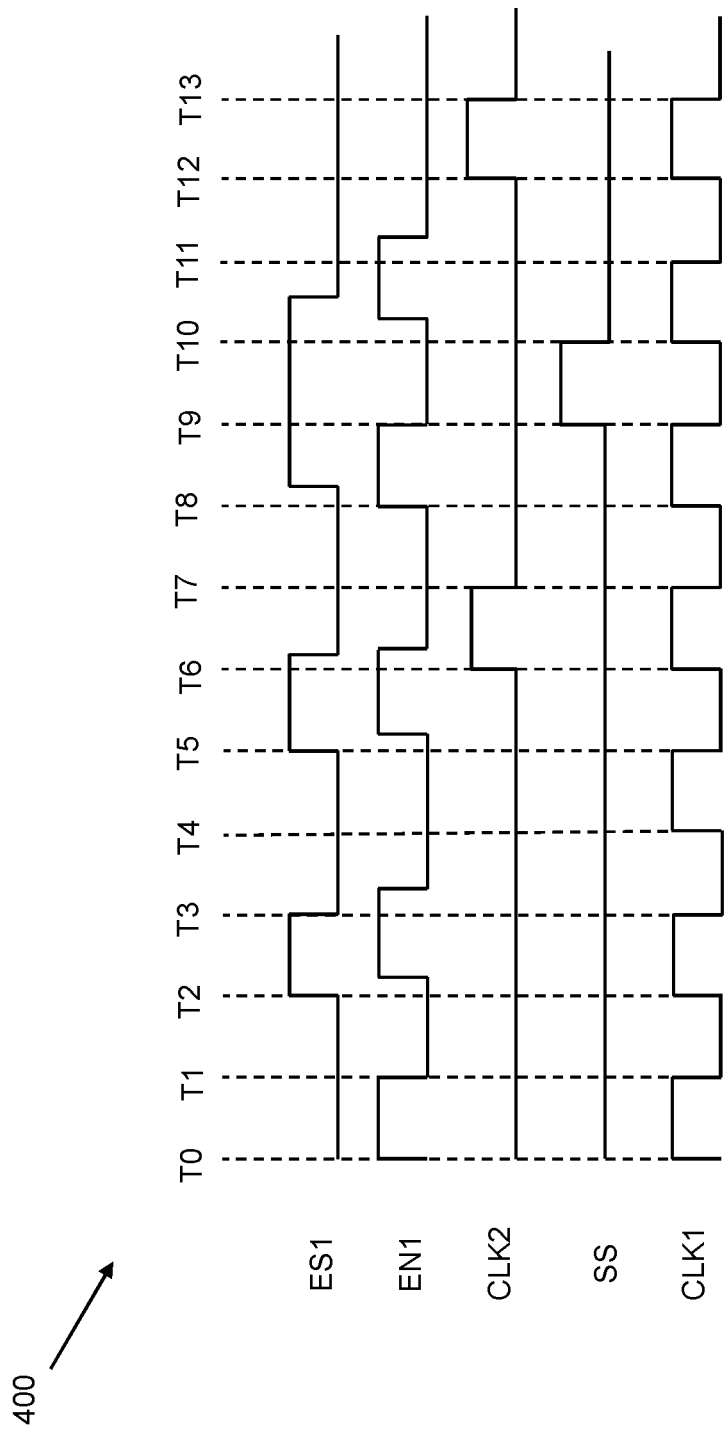
FIG. 4 represents a timing diagram that illustrates an operation of the signal toggling detection and correction circuit of FIG. 2 in accordance with an embodiment of the present disclosure.

FIG. 4 represents a timing diagram 400 that illustrates an operation of the signal toggling detection and correction circuit 106 of FIG. 2 in accordance with an embodiment of the present disclosure. The first clock signal CLK1 provided to the first flip-flop 204 may be a continuous clock signal.

During time period T0-T1, the first clock signal CLK1 may be asserted. Further, the control circuit 209 may output the asserted first enable signal EN1. The control circuit 209 may further determine whether the error signal ES1 is in a de-asserted state or asserted state. It may be assumed that the error signal ES1 may be in the de-asserted state. The first enable signal EN1 may be de-asserted at time instance T1 and may continue to remain in the de-asserted state during time period T1-T2. Further, the first clock signal CLK1 may transition from the asserted state to a de-asserted state at time instance T1. The first clock signal CLK1 may remain de-asserted during the time period T1-T2. The first clock signal CLK1 may further transition from the de-asserted state to the asserted state at time instance T2.

During time period T2-T3, the error signal ES1 may be asserted, e.g., at a logic high state. The assertion of the error signal ES1 may indicate the presence of a faulty component in the signal toggling detection and correction circuit 106. The control circuit 209 may assert the first enable signal EN1 during the time period T2-T3 based on the assertion of the error signal ES1. At time instance T3, the error signal ES1 is de-asserted indicating that the fault may be present in the latch 214. Based on the assertion of the first enable signal EN1, the toggling of the first checker signal CHK1 may be corrected. The first enable signal EN1 may be de-asserted by the control circuit 209 during the time period T3-T4, after the de-assertion of the error signal ES1.

During time period T5-T6, the error signal ES1 may be asserted again. The control circuit 209 may be configured to assert the first enable signal EN1 during time period T5-T7. The error signal ES1 may remain in the asserted state on the assertion of the first enable signal EN1 indicating that the fault may be present in the second flip-flop 216. The control circuit 209 further asserts the second clock signal CLK2 at time instance T6 and provides it to the first flip-flop 204. The second clock signal CLK2 may remain asserted during the time period T6-T7. The assertion of the second clock signal CLK2 may correct the toggling of the second checker signal CHK2, and the error signal ES1 may change to the de-asserted state during the time period T6-T7.

Based on the assertion of the first enable signal EN1, the error signal ES1 may be asserted during the time period T8-T9. As the error signal ES1 may be asserted on the assertion of the first enable signal EN1, the control circuit 209 may be configured to determine that the flop output signal FOP has toggled, and assert the select signal SS at time instance T9. The select signal SS may remain asserted during the time period T9-T10. The first enable signal EN1 may be asserted during the time period T10-T11. The error signal ES1 may be de-asserted during the time period T10-T11 based on the assertion of the select signal SS and the assertion of the first clock signal CLK1. Further, the select signal SS may be de-asserted at time instance T10. The de-assertion of the error signal ES1 may further indicate that the toggling of the error signal ES1 may occur due to a fault in the first flip-flop 204. The toggling of the flop output signal FOP may thus be corrected during the time period T8-T10. The toggling of the first checker signal CHK1 due to the toggling of the flop output signal FOP may be corrected during the time period T10-T11. Further, after the correction of the toggling of the flop output signal FOP, the second clock signal CLK2 may be asserted during time period T12-T13 to refresh the second flip-flop 216 (e.g., to ensure that the second checker signal CHK2 is same as the first checker signal CHK1).

The timing diagram for the signal toggling detection and correction circuit 106 of FIG. 3 though not illustrated, is similar to the timing diagram 400 illustrated in FIG. 4.

FIG. 5 represents a high-level flowchart 500 illustrating the operation of the signal toggling detection and correction circuit 106 of FIG. 2 in accordance with an embodiment of the present disclosure. At step 502, the first flip-flop 204 may be configured to output the flop output signal FOP. At step 504, the checker circuit 206 may receive the flop output signal FOP. At step 506, the checker circuit 206 may output the set of checker signals. At step 508, the fault monitoring circuit 207 may determine whether the first flip-flop 204 and the checker circuit 206 may be faulty based on the toggling of at least one checker signal of the set of checker signals. If at step 508, the fault monitoring circuit 207 determines that the first flip-flop 204 and the checker circuit 206 are not faulty, the fault monitoring circuit 207 waits until one of the first flip-flop 204 and the checker circuit 206 become faulty. However, if at step 508, the fault monitoring circuit 207 determines that the first flip-flop 204 is faulty, step 510 is performed. Further, if it is determined that the checker circuit 206 is faulty, step 512 is performed. At step 510, the signal toggling detection and correction circuit 106 may correct the toggling of the flop output signal FOP and at least one checker signal (such as the first checker signal CHK1) based on the determination that the first flip-flop 204 is faulty. At step 512, the signal toggling detection and correction circuit 106 may correct the toggling of at least one checker signal (such as the first checker signal CHK1 or the second checker signal CHK2) of the set of checker signals based on the determination that the checker circuit 206 is faulty.

Figure 6A:
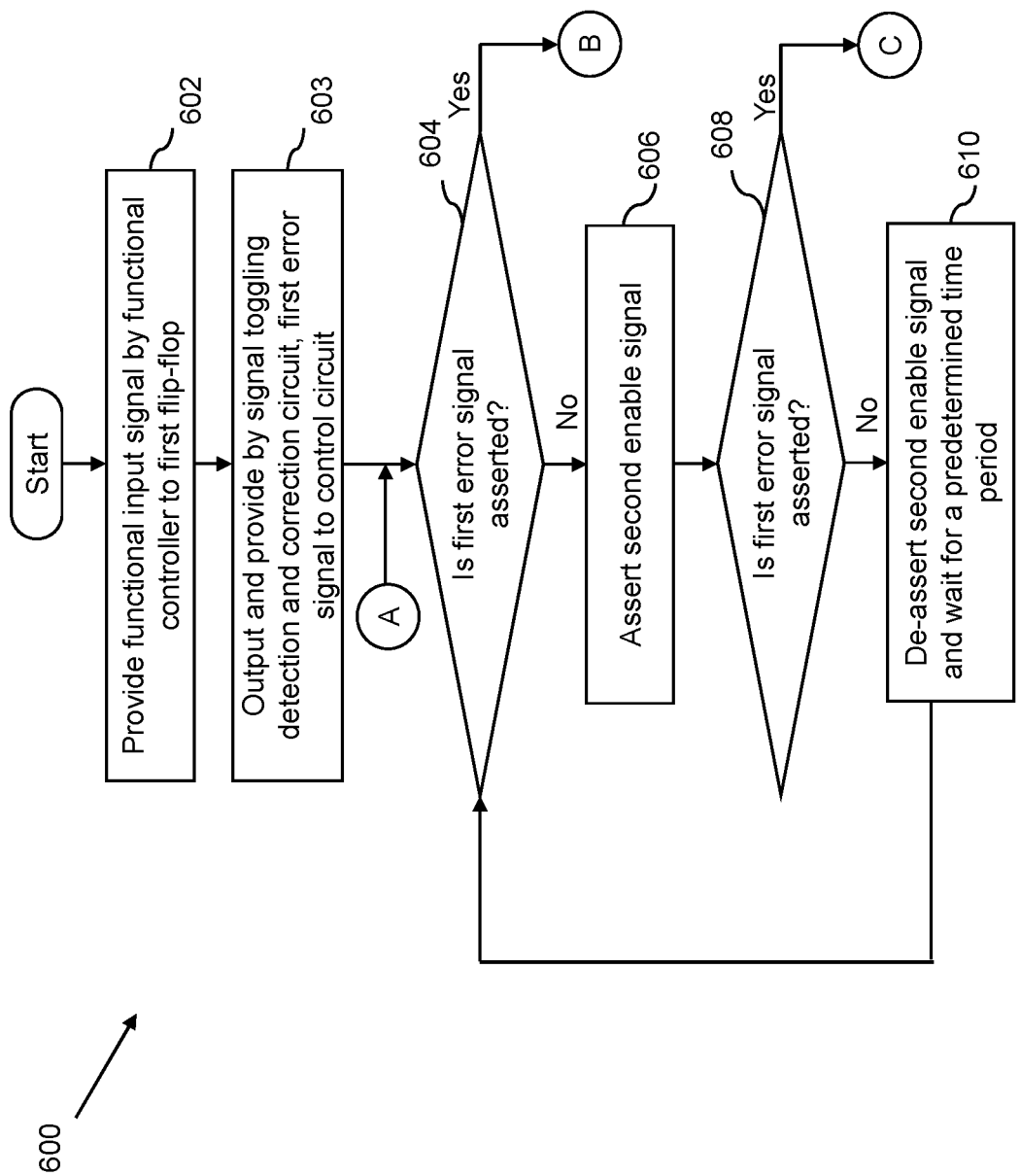
Figure 6B:
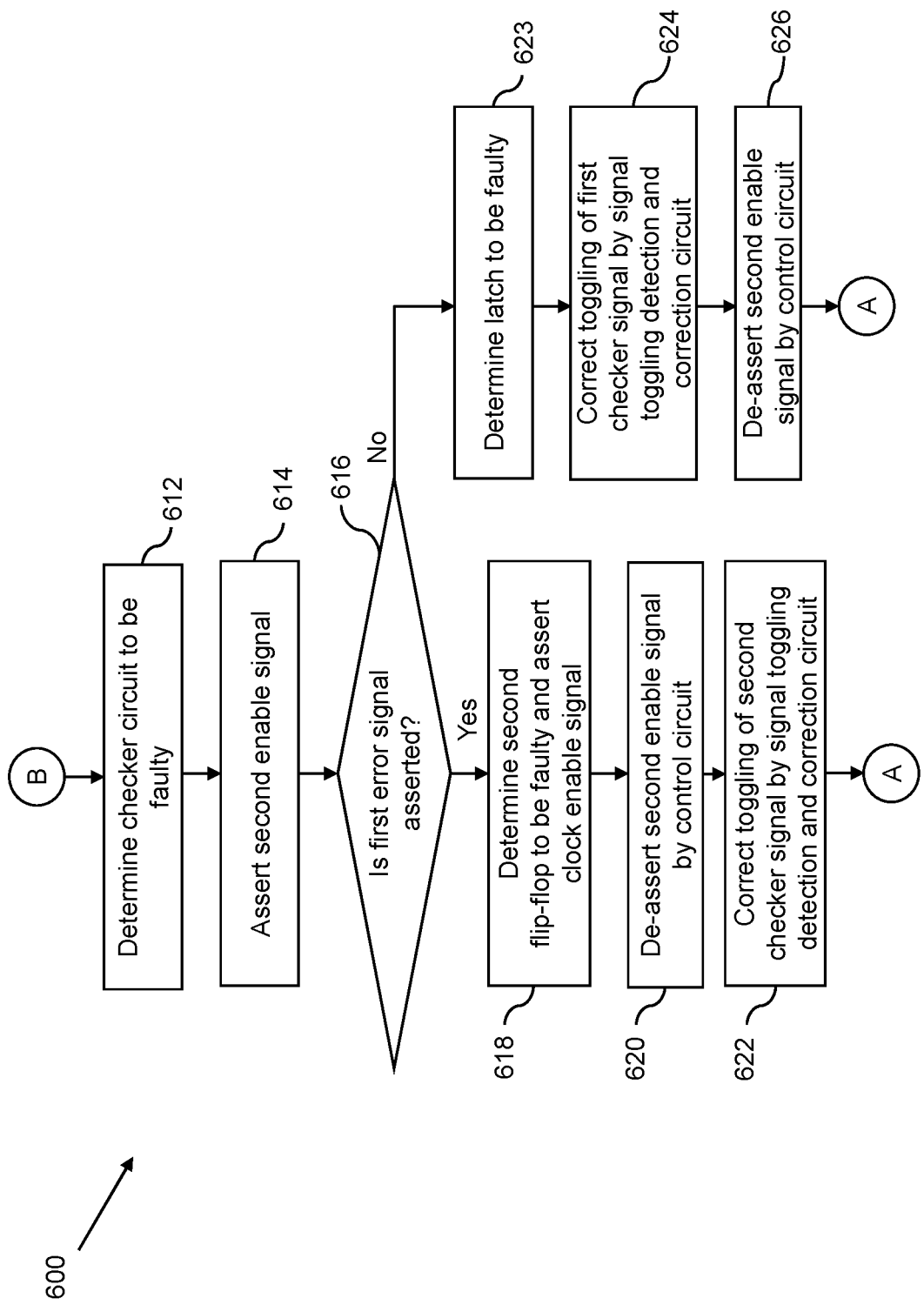

FIGS. 6A-6C represent a flowchart 600 illustrating the operation of the functional controller 102, the control circuit 209, and the signal toggling detection and correction circuit 106 in accordance with an embodiment of the present disclosure. Referring now to FIG. 6A, at step 602, the functional controller 102 may provide the functional input signal FIP to the signal toggling detection and correction circuit 106. At step 603, the signal toggling detection and correction circuit 106 may output and provide the error signal ES1 to the control circuit 209. At step 604, the control circuit 209 may determine whether the error signal ES1 may be asserted.

At step 606, if the control circuit 209 may determine that the error signal ES1 may be in the logic low state, e.g., de-asserted, the control circuit 209 may assert the second enable signal EN2. Based on the assertion of the second enable signal EN2, the first enable signal EN1 may be asserted and provided to the first flip-flop 204. At step 608, the control circuit 209 may further determine whether the error signal ES1 has remained asserted. If the error signal ES1 remains de-asserted, the control circuit 209 may determine that none of the components in the signal toggling detection and correction circuit 106 are faulty. At step 610, the control circuit 209 may further de-assert the second enable signal EN2 and wait for a predetermined time period and return to step 604 on completion of the waiting of the predetermined time period. At step 604, the control circuit 209 may determine whether the error signal ES1 may be asserted. If at step 604, the control circuit 209 may determine that the error signal ES1 may be asserted, step 612 may be performed.

Referring now to FIG. 6B, at step 612, the control circuit 209 may further determine that the checker circuit 206 may be faulty. At step 614, to determine whether the latch 214 and the second flip-flop 216 may be faulty, the control circuit 209 may assert the second enable signal EN2. The first enable signal EN1 may be asserted based on the assertion of the second enable signal EN2 and provided to the latch 214. At step 616, the control circuit 209 may further determine whether the error signal ES1 has remained asserted. If at step 616, the control circuit 209 may determine that the error signal ES1 remains asserted, step 618 is performed.

At step 618, the control circuit 209 determines that the second flip-flop 216 may be faulty. Further, the control circuit 209 may assert the first clock control signal CL1. Based on the assertion of the first clock control signal CL1, the second clock control signal CL2 may be asserted. At step 620, the control circuit 209 may de-assert the second enable signal EN2. Thus, the first enable signal EN1 may be de-asserted based on the de-assertion of the second enable signal EN2 and the de-asserted first enable signal EN1 may be provided to the signal toggling detection and correction circuit 106. Based on the assertion of the second clock control signal CL2, the second clock signal CLK2 may be asserted and provided to the signal toggling detection and correction circuit 106. At step 622, the signal toggling detection and correction circuit 106 may correct the toggling of the second checker signal CHK2. After step 622, step 604 is performed. Steps 604-616 are further performed.

If at step 616, the control circuit 209 may determine that the error signal ES1 has not remained asserted, e.g., the error signal ES1 may be de-asserted, step 623 is performed. At step 623, the control circuit 209 determines that the latch 214 may be faulty. At step 624, the signal toggling detection and correction circuit 106 may correct the toggling of the first checker signal CHK1 based on the assertion of the first enable signal EN1 that may be asserted based on the assertion of the second enable signal EN2. At step 626, the control circuit 209 may de-assert the second enable signal EN2. After step 626, step 604 is performed. Steps 606 and 608 are further performed.

At step 608, if the control circuit 209 determines that the error signal ES1 has remained asserted, step 628 is performed. Referring now to FIG. 6C, at step 628, based on the assertion of the error signal ES1, the control circuit 209 may determine that the first flip-flop 204 may be faulty. The control circuit 209 may further de-assert the second enable signal EN2 after the error signal ES1 transitions to the asserted state. At step 630, the control circuit 209 may assert the select signal SS. The select signal SS may be provided to the restoration circuit 210. At step 632, the first flip-flop 204 may receive the inverted first checker signal ICHK1 from the restoration circuit 210. The signal toggling detection and correction circuit 106 may correct the toggling of the flop output signal FOP based on the assertion of the first clock signal CLK1 and the provision of the inverted first checker signal ICHK1 by the restoration circuit 210 to the first flip-flop 204.

At step 634, the control circuit 209 may de-assert the select signal SS. Based on the de-assertion of the select signal SS, the restoration circuit 210 may provide the functional input signal FIP to the first flip-flop 204. The control circuit 209 may further assert the second enable signal EN2. The first enable signal EN1 may be asserted based on the assertion of the second enable signal EN2, and provided to the latch 214. At step 636, the signal toggling detection and correction circuit 106 may correct the toggling of the first checker signal CHK1 based on the corrected flop output signal FOP and the asserted first enable signal EN1.

With reference to the signal toggling and detection circuit of FIG. 3, similar steps are performed to correct the toggling of the first checker signal CHK1 and the second checker signal CHK2. Further, the toggling of the restoration signal RS may be corrected based on the inverted first checker signal ICHK1 and the assertion of the select signal SS. In addition, the toggling of the flop output signal FOP may be corrected when the IC 100 may be reset.

Conventionally, to correct toggling of signals due to faulty components on an integrated circuit (IC), a correction circuitry is included on the IC. The correction circuitry may test the IC intermittently. However, the correction circuitry is not configured to differentiate whether the signals toggle due to faulty components of the conventional IC or faults introduced by the correction circuitry. In addition, functional operations of the IC are halted for several clock cycles during the correction of toggling of signals performed by the correction circuitry.

The IC 100 that includes the signal toggling detection and correction circuit 106 may be configured to perform other operations during the detection and correction of toggling of signals in the checker circuit 206 thereby resulting in an increase in the availability of the IC 100. The signal toggling detection and correction circuit 106 may be further configured to differentiate whether the toggling of signals arises due to faults in the first flip-flop 204 or the toggling of signals arises due to faults in the checker circuit 206. Based on the differentiation, the toggling of each of the flop output signal FOP, the first checker signal CHK1, and the second checker signal CHK2 is corrected thereby increasing the reliability of the IC 100. The signal toggling detection and correction circuit 106 may further correct the toggling of each of the flop output signal FOP, the first checker signal CHK1, and the second checker signal CHK2 in a corresponding clock cycle of the first clock signal CLK1. Thus, the IC 100 remains in the safe state for a single clock cycle during the correction of the toggling of the flop output signal FOP.

The term "assert" is used to mean placing a signal in an active state. For example, for an active-low signal, the signal is at a logic low state when asserted, and for an active-high signal, the signal is at a logic high state when asserted.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A signal toggling detection and correction circuit comprising:
   a first flip-flop that is configured to output a flop output signal, wherein the flop output signal toggles based on a fault in the first flip-flop;
   a checker circuit that is coupled to the first flip-flop, and configured to receive the flop output signal and output a set of checker signals based on the flop output signal, wherein at least one checker signal of the set of checker signals toggles based on one of a group consisting of the fault in the first flip-flop and a fault in the checker circuit; and
   a fault monitoring circuit configured to determine whether one of a group consisting of the first flip-flop and the checker circuit is faulty based on the toggling of the at least one checker signal of the set of checker signals, wherein based on the determination that the first flip-flop is faulty, the fault monitoring circuit is configured to correct the toggling of the flop output signal and the toggling of the at least one checker signal of the set of checker signals, and wherein based on the determination that the checker circuit is faulty, the fault monitoring circuit is configured to correct the toggling of the at least one checker signal of the set of checker signals.

2. The signal toggling detection and correction circuit of claim 1, wherein the checker circuit comprises:
   a latch configured to receive the flop output signal and a first enable signal, and output a first checker signal of the set of checker signals; and
   a second flip-flop that is coupled to the latch, and configured to receive the first checker signal and a clock signal, and output a second checker signal of the set of checker signals, wherein the second checker signal is same as the first checker signal based on a transition of the clock signal, wherein the first checker signal toggles based on one of a group consisting of the toggling of the flop output signal and a fault in the latch, and the second checker signal toggles based on a fault in the second flip-flop, and wherein the fault in the checker circuit corresponds to one of a group consisting of the fault in the latch and the fault in the second flip-flop.

3. The signal toggling detection and correction circuit of claim 2, wherein the fault monitoring circuit comprises a logic circuit that is coupled to the latch and the second flip-flop, wherein the logic circuit is configured to receive the first checker signal and the second checker signal and output an error signal, and wherein the error signal is asserted based on toggling of one of a group consisting of the first checker signal and the second checker signal.

4. The signal toggling detection and correction circuit of claim 3, wherein the fault monitoring circuit further comprises a control circuit that is coupled to the logic circuit, and configured to receive the error signal, determine whether the error signal is in one of a group consisting of a de-asserted state and an asserted state, and output a second enable signal and a select signal, wherein the first enable signal is derived from the second enable signal such that assertion of the second enable signal results in assertion of the first enable signal, and wherein the assertion of the first enable signal results in the first checker signal being same as the flop output signal.

5. The signal toggling detection and correction circuit of claim 4, wherein when the control circuit determines that the error signal is in the de-asserted state, the control circuit is further configured to:
assert the second enable signal;
determine whether the error signal has transitioned to the asserted state after the assertion of the second enable signal;
determine that the first flip-flop is faulty when the error signal has transitioned to the asserted state, wherein the error signal transitions to the asserted state based on the toggling of the first checker signal as a result of the assertion of the first enable signal; and
assert the select signal to correct the toggling of the flop output signal.

6. The signal toggling detection and correction circuit of claim 4, wherein when the error signal is in the asserted state, the control circuit is further configured to determine that one of a group consisting of the latch and the second flip-flop is faulty, wherein the control circuit is further configured to assert the second enable signal, and wherein the control circuit is further configured to determine whether the error signal has transitioned to the de-asserted state after the assertion of the second enable signal.

7. The signal toggling detection and correction circuit of claim 6, wherein when the control circuit determines that the error signal has remained in the asserted state, the control circuit further determines that the second flip-flop is faulty, and wherein based on the determination that the second flip-flop is faulty, the control circuit is further configured to generate a clock control signal to assert the clock signal and correct the toggling of the second checker signal.

8. The signal toggling detection and correction circuit of claim 6, wherein when the control circuit determines that the error signal has transitioned to the de-asserted state, the control circuit further determines that the latch is faulty, and wherein the second enable signal remains asserted to correct the toggling of the first checker signal.

9. The signal toggling detection and correction circuit of claim 5, wherein the fault monitoring circuit further comprises a restoration circuit that is coupled to the first flip-flop and the latch, and configured to receive the first checker signal, the select signal, and a functional input signal, wherein the restoration circuit is further configured to provide one of a group consisting of the functional input signal and an inverted first checker signal to the first flip-flop based on the select signal, and wherein when the select signal is asserted, the restoration circuit provides the inverted first checker signal to the first flip-flop to correct the toggling of the flop output signal.

10. The signal toggling detection and correction circuit of claim 5, wherein the control circuit is further configured to de-assert the second enable signal after the error signal transitions to the asserted state, wherein the toggling of the flop output signal results in the toggling of the first checker signal, wherein after the assertion of the select signal, the control circuit is further configured to assert the second enable signal to correct the toggling of the first checker signal, and wherein the toggling of the first checker signal is corrected based on the assertion of the first enable signal and the correction of the toggling of the flop output signal.

11. The signal toggling detection and correction circuit of claim 9, wherein the restoration circuit comprises:
a first logic gate that is coupled to the latch, and configured to receive the first checker signal and output the inverted first checker signal; and
a multiplexer coupled to the first logic gate and the first flip-flop, and configured to receive the inverted first checker signal, the select signal, and the functional input signal, and output one of the group consisting of the functional input signal and the inverted first checker signal based on the select signal, wherein when the select signal is asserted, the inverted first checker signal is provided to the first flip-flop, and when the select signal is de-asserted, the functional input signal is provided to the first flip-flop.

12. A signal toggling detection and correction circuit comprising:
a first flip-flop that is configured to output a flop output signal;
a checker circuit that is coupled to the first flip-flop, and configured to receive a restoration signal that is outputted based on the flop output signal and output a set of checker signals based on the restoration signal, wherein the restoration signal toggles based on a fault in the first flip-flop, and wherein at least one checker signal of the set of checker signals toggles based on one of a group consisting of the fault in the first flip-flop and a fault in the checker circuit; and
a fault monitoring circuit configured to determine whether one of a group consisting of the first flip-flop and the checker circuit is faulty based on the toggling of the at least one checker signal of the set of checker signals, wherein based on the determination that the first flip-flop is faulty, the fault monitoring circuit is configured to correct the toggling of the restoration signal and the toggling of the at least one checker signal of the set of checker signals, and wherein based on the determination that the checker circuit is faulty, the fault monitoring circuit is configured to correct the toggling of the at least one checker signal of the set of checker signals.

13. The signal toggling detection and correction circuit of claim 12, wherein the checker circuit comprises:
a latch configured to receive the restoration signal and a first enable signal, and output a first checker signal of the set of checker signals; and
a second flip-flop that is coupled to the latch, and configured to receive the first checker signal and a clock signal, and output a second checker signal of the set of checker signals, wherein the second checker signal is same as the first checker signal based on a transition of the clock signal, wherein the first checker signal toggles based on one of a group consisting of the toggling of the restoration signal and a fault in the latch, and the second checker signal toggles based on a fault in the second flip-flop, and wherein the fault in the checker circuit corresponds to one of a group consisting of the fault in the latch and the fault in the second flip-flop.

14. The signal toggling detection and correction circuit of claim 13, wherein the fault monitoring circuit comprises a logic circuit that is coupled to the latch and the second flip-flop, wherein the logic circuit is configured to receive the first checker signal and the second checker signal and output an error signal, and wherein the error signal is asserted based on the toggling of one of a group consisting of the first checker signal and the second checker signal.

15. The signal toggling detection and correction circuit of claim 14, wherein the fault monitoring circuit further comprises a control circuit that is coupled to the logic circuit, and configured to receive the error signal, determine whether the error signal is in one of a group consisting of a de-asserted state and an asserted state, and output a second enable signal and a select signal, wherein the first enable signal is derived from the second enable signal such that assertion of the second enable signal results in assertion of the first enable signal, and wherein the assertion of the first enable signal results in the first checker signal being same as the restoration signal.

16. The signal toggling detection and correction circuit of claim 15, wherein when the control circuit determines that the error signal is in the de-asserted state, the control circuit is further configured to:
 assert the second enable signal;
 determine whether the error signal has transitioned to the asserted state after the assertion of the second enable signal;
 determine that the first flip-flop is faulty when the error signal has transitioned to the asserted state, wherein the error signal transitions to the asserted state based on the toggling of the first checker signal as a result of the assertion of the first enable signal; and
 assert the select signal to correct the toggling of the restoration signal.

17. The signal toggling detection and correction circuit of claim 16, wherein the fault monitoring circuit further comprises a restoration circuit that is coupled to the first flip-flop and the latch, and configured to receive the first checker signal, the select signal, and the flop output signal, wherein the restoration circuit is further configured to provide one of a group consisting of the flop output signal and an inverted first checker signal to the checker circuit based on the select signal, and wherein when the select signal is asserted, the restoration circuit provides the inverted first checker signal as the restoration signal to the checker circuit to correct the toggling of the restoration signal.

18. The signal toggling detection and correction circuit of claim 16, wherein when the error signal is in the asserted state, the control circuit is further configured to (i) determine that one of a group consisting of the latch and the second flip-flop is faulty, (ii) assert the second enable signal, and (iii) determine whether the error signal has transitioned to the de-asserted state after the assertion of the second enable signal, wherein when the error signal has remained in the asserted state, the control circuit is further configured to determine that the second flip-flop is faulty, and generate a clock control signal to assert the clock signal and correct the toggling of the second checker signal, wherein when the error signal has transitioned to the de-asserted state, the control circuit is further configured to determine that the latch is faulty, and wherein the second enable signal remains asserted to correct the toggling of the first checker signal.

19. The signal toggling detection and correction circuit of claim 17, wherein the first enable signal is derived from the second enable signal such that assertion of the second enable signal results in assertion of the first enable signal, and wherein when the first checker signal toggles based on the toggling of the restoration signal, the toggling of the first checker signal is corrected based on the assertion of the first enable signal and the correction of the toggling of the restoration signal.

20. A signal toggling detection and correction circuit, comprising:
 a first flip-flop configured to output a flop output signal;
 a checker circuit configured to receive one of a group consisting of the flop output signal and a restoration signal, and output a set of checker signals, wherein one of a group consisting of (i) the flop output signal toggles and (ii) the restoration signal toggles based on a fault in the first flip-flop, and wherein at least one checker signal of the set of checker signals toggles based on one of a group consisting of the fault in the first flip-flop and a fault in the checker circuit; and
 a fault monitoring circuit configured to determine whether one of a group consisting of the first flip-flop and the checker circuit is faulty based on the toggling of the at least one checker signal of the set of checker signals, wherein based on the determination that the first flip-flop is faulty, the fault monitoring circuit is configured to correct (i) the toggling of one of a group consisting of the flop output signal and the restoration signal, and (ii) the toggling of the at least one checker signal of the set of checker signals, and wherein based on the determination that the checker circuit is faulty, the fault monitoring circuit is configured to correct the toggling of the at least one checker signal of the set of checker signals.

\* \* \* \* \*